(12) United States Patent
Hyvonen et al.

(10) Patent No.: US 8,886,135 B2
(45) Date of Patent: Nov. 11, 2014

(54) APPARATUS, METHODS, COMPUTER PROGRAMS AND COMPUTER READABLE STORAGE MEDIUMS FOR WIRELESS COMMUNICATIONS

(75) Inventors: Lassi Pentti Olavi Hyvonen, Helsinki (FI); Joonas Veli-Allan Krogerus, Espoo (FI); Pei Li, Espoo (FI); Arto Tapio Hujanen, Espoo (FI); Matti Kalevi Somersalo, Espoo (FI)

(73) Assignee: Nokia Corporation, Espoo (FI)

( * ) Notice: Subject to any disclaimer, the term of this patent is extended or adjusted under 35 U.S.C. 154(b) by 137 days.

(21) Appl. No.: 13/699,874

(22) PCT Filed: May 24, 2010

(86) PCT No.: PCT/IB2010/052291
§ 371 (c)(1),
(2), (4) Date: Jan. 11, 2013

(87) PCT Pub. No.: WO2011/148225
PCT Pub. Date: Dec. 1, 2011

(65) Prior Publication Data
US 2013/0122829 A1    May 16, 2013

(51) Int. Cl.
*H04B 1/40* (2006.01)
*H01Q 1/52* (2006.01)
*H01Q 1/24* (2006.01)
*H01Q 21/30* (2006.01)
*H03H 7/38* (2006.01)

(52) U.S. Cl.
CPC .............. *H04B 1/40* (2013.01); *H01Q 1/521* (2013.01); *H03H 7/38* (2013.01); *H01Q 1/242* (2013.01); *H01Q 21/30* (2013.01)
USPC ............... 455/77; 455/78; 455/323; 455/334; 455/550.1

(58) Field of Classification Search
USPC .............. 455/77, 78, 83, 90.3, 280, 287, 313, 455/323, 334, 550.1
See application file for complete search history.

(56) References Cited

U.S. PATENT DOCUMENTS 7,557,761 B2    7/2009  Iwai et al. ...................... 343/702
7,848,713 B2 *  12/2010  Cabanillas et al. ............. 455/83
(Continued)

FOREIGN PATENT DOCUMENTS

CN    101316008 A    12/2008
CN    101536309 A    9/2009
(Continued)

OTHER PUBLICATIONS

Diallo, A., et al., "Reduction of the Mutual Coupling Between Two Planar Inverted-F Antennas Working in Close Frequency Bands", Automatika 47 (2006), 3-4, 8 pgs.

(Continued)

*Primary Examiner* — Nhan Le
(74) *Attorney, Agent, or Firm* — Harrington & Smith

(57) ABSTRACT

An apparatus including a first port configured to receive signals from a transceiver and to receive a first antenna; a second port configured to receive signals from a transceiver and to receive a second antenna; a first reactive component coupled to the first port; a second reactive component coupled to the first reactive component at a first junction and to the second port, wherein at least the first reactive component is configured to have an impedance that shifts the phase of a first signal, in a second operational resonant frequency band, received from the first antenna, and the second reactive component is configured to have an impedance that shifts the phase of a second signal, in the second operational resonant frequency band, received from the transceiver, so that the first signal and the second signal at least partially destructively interfere with one another at the first junction.

20 Claims, 5 Drawing Sheets

(56) References Cited

U.S. PATENT DOCUMENTS

| | | | |
|---|---|---|---|
| 8,369,808 B2 * | 2/2013 | Adams et al. | 455/193.1 |
| 8,600,462 B2 * | 12/2013 | Kato | 455/575.7 |
| 8,649,740 B2 * | 2/2014 | Lin et al. | 455/83 |
| 2005/0226353 A1 | 10/2005 | Gebara et al. | 375/346 |
| 2006/0279465 A1 | 12/2006 | Moon et al. | 343/700 |
| 2008/0165063 A1 | 7/2008 | Schlub et al. | 343/702 |
| 2008/0258991 A1 | 10/2008 | Montgomery et al. | 343/844 |
| 2008/0297419 A1 | 12/2008 | Dou et al. | 343/702 |
| 2009/0079655 A1 | 3/2009 | Kim et al. | 343/846 |

FOREIGN PATENT DOCUMENTS

| | | |
|---|---|---|
| CN | 101615725 A | 12/2009 |
| EP | 2 097 950 | 5/2008 |
| EP | 2 139 067 A1 | 12/2009 |
| GB | 2 304 496 A | 3/1997 |
| KR | 10-2009-0093120 | 9/2009 |
| WO | WO 2008/059316 A1 | 5/2008 |
| WO | WO-2008/111816 A1 | 9/2008 |

OTHER PUBLICATIONS

Ranvier, et al., "Capacity enhancement by increasing both mutual coupling and efficiency: a novel approach", IEEE, (2007), (pp. 3632-3635).

Chen et al., "A decoupling technique for increasing the port isolation between two strongly coupled antennas", IEEE Transactions on Antennas and Propagation, vol. 56, No. 12, (Dec. 2008), (pp. 3650-3658).

* cited by examiner

APPARATUS, METHODS, COMPUTER PROGRAMS AND COMPUTER READABLE STORAGE MEDIUMS FOR WIRELESS COMMUNICATIONS

FIELD OF THE INVENTION

Embodiments of the present invention relate to apparatus, methods, computer programs and computer readable storage mediums. In particular, they relate to apparatus, methods, computer programs and computer readable storage mediums in a mobile cellular telephone.

BACKGROUND TO THE INVENTION

Apparatus, such as mobile cellular telephones, usually include an antenna arrangement for wireless communication. Where the antenna arrangement includes two or more antennas, the antennas may electromagnetically couple and interfere with one another. The electromagnetic coupling/interference between antennas increases as the distance between the antennas is reduced. Consequently, where the antenna arrangement is required to fit into a relatively small space, the antenna arrangement may be inefficient or even inoperable.

It would therefore be desirable to provide an alternative apparatus.

BRIEF DESCRIPTION OF VARIOUS EMBODIMENTS OF THE INVENTION

According to various, but not necessarily all, embodiments of the invention there is provided an apparatus comprising: a first port configured to receive signals from a transceiver and to receive a first antenna, the first antenna being configured to operate in a first operational resonant frequency band; a second port configured to receive signals from a transceiver and to receive a second antenna, the second antenna being configured to operate in a second operational resonant frequency band; a first reactive component coupled to the first port; a second reactive component coupled to the first reactive component at a first junction and to the second port, wherein at least the first reactive component is configured to have an impedance that shifts the phase of a first signal, in the second operational resonant frequency band, received from the first antenna, and the second reactive component is configured to have an impedance that shifts the phase of a second signal, in the second operational resonant frequency band, received from the transceiver, so that the first signal and the second signal at least partially destructively interfere with one another at the first junction.

The apparatus may be for wireless communication.

The first reactive component may have a plurality of selectable impedances for enabling the phase of the first signal to be variably shifted. The apparatus may further comprise a controller configured to select the impedance of the first reactive component and tune the first operational resonant frequency band of the first antenna and tune the phase shift of the first reactive component. The controller may be configured to determine if the impedance of the first reactive component requires tuning, and to select an impedance of the first reactive component if the controller determines that the impedance requires tuning. The first reactive component may have a plurality of selectable resistances for enabling the phase and amplitude of the first signal to be fine tuned.

The second reactive component may have a plurality of selectable impedances for enabling the phase of the second signal to be variably shifted. The second reactive component may have a plurality of selectable resistances for enabling the phase and amplitude of the second signal to be fine tuned.

The impedance and location of the first reactive component may at least partially determine the phase and amplitude of the first signal at the first junction. The impedance and location of the second reactive component may at least partially determine the phase and amplitude of the second signal at the first junction.

The apparatus may further comprise a third reactive component coupled to the second port and to the second reactive component at a second junction, wherein at least the third reactive component is configured to have an impedance that shifts the phase of a third signal, in the first operational resonant frequency band, received from the second antenna, and the second reactive component is configured to have an impedance that shifts the phase of a fourth signal, in the first operational resonant frequency band, received from the transceiver, so that the third signal and the fourth signal at least partially destructively interfere with one another at the second junction.

The third reactive component may have a plurality of selectable impedances for enabling the phase of the third signal to be shifted. The apparatus may further comprise a controller configured to select the impedance of the third reactive component and tune the second operational resonant frequency band of the second antenna and tune the phase shift of the third reactive component. The controller may be configured to determine if the impedance of the third reactive component requires tuning, and to select an impedance of the third reactive component if the controller determines that the impedance requires tuning. The third reactive component may have a plurality of selectable resistances for enabling the phase and amplitude of the third signal to be fine tuned.

The second reactive component may have a plurality of selectable impedances for enabling the phase of the fourth signal to be variably shifted. The second reactive component may have a plurality of selectable resistances for enabling the phase and amplitude of the fourth signal to be fine tuned.

The impedance and location of the third reactive component may at least partially determine the phase and amplitude of the third signal at the second junction, and the impedance and location of the second reactive component at least partially determine the phase and amplitude of the fourth signal at the second junction.

The first antenna may be configured to be non resonant in the first operational resonant frequency band, and/or the second antenna may be configured to be non-resonant in the second operational resonant frequency band.

The first operational resonant frequency band may at least partially overlap with the second operational resonant frequency band.

According to various, but not necessarily all, embodiments of the invention there is provided a device comprising an apparatus as described in any of the preceding paragraphs.

According to various, but not necessarily all, embodiments of the invention there is provided a mobile cellular telephone comprising an apparatus as described in any of the preceding paragraphs.

According to various, but not necessarily all, embodiments of the invention there is provided a method comprising: providing a first port configured to receive signals from a transceiver and to receive a first antenna, the first antenna being configured to operate in a first operational resonant frequency band, a second port configured to receive signals from a transceiver and to receive a second antenna, the second antenna being configured to operate in a second operational resonant frequency band, a first reactive component being coupled to the first port, a second reactive component being coupled to the first reactive component at a first junction and to the second port; and configuring at least the first reactive component to have an impedance that shifts the phase of a first signal, in the second operational resonant frequency band, received from the first antenna, and the second reactive component to have an impedance that shifts the phase of a second signal, in the second operational resonant frequency band, received from the transceiver, so that the first signal and the second signal at least partially destructively interfere with one another at the first junction.

The first reactive component may have a plurality of selectable impedances for enabling the phase of the first signal to be variably shifted. The method may further comprise providing a controller configured to select the impedance of the first reactive component and tune the first operational resonant frequency band of the first antenna and tune the phase shift of the first reactive component. The controller may be configured to determine if the impedance of the first reactive component requires tuning, and to select an impedance of the first reactive component if the controller determines that the impedance requires tuning.

The method may further comprise providing a third reactive component coupled to the second port and to the second reactive component at a second junction, and configuring at least the third reactive component to have an impedance that shifts the phase of a third signal, in the first operational resonant frequency band, received from the second antenna, and the second reactive component to have an impedance that shifts the phase of a fourth signal, in the first operational resonant frequency band, received from the transceiver, so that the third signal and the fourth signal at least partially destructively interfere with one another at the second junction.

The third reactive component may have a plurality of selectable impedances for enabling the phase of the third signal to be shifted. The method may further comprise providing a controller configured to select the impedance of the third reactive component and tune the second operational resonant frequency band of the second antenna and tune the phase shift of the third reactive component. The controller may be configured to determine if the impedance of the third reactive component requires tuning, and to select an impedance of the third reactive component if the controller determines that the impedance requires tuning.

According to various, but not necessarily all, embodiments of the invention there is provided a computer readable storage medium encoded with instructions that, when executed by a processor perform: selecting an impedance of a first reactive component to tune a first operational resonant frequency band of a first antenna and tune a phase shift provided by the first reactive component, the first reactive component being coupled to a first port configured to receive signals from a transceiver and to receive the first antenna, the first antenna being configured to operate in the first operational resonant frequency band, and coupled to a second reactive component, the second reactive component being coupled to a second port configured to receive signals from a transceiver and to receive a second antenna, the second antenna being configured to operate in a second operational frequency band, at least the first reactive component being configured to have an impedance that shifts the phase of a first signal, in the second operational resonant frequency band, received from the first antenna, and the second reactive component being configured to have an impedance that shifts the phase of a second signal, in the second operational resonant frequency band, received from the transceiver, so that the first signal and the second signal at least partially destructively interfere with one another at the first junction.

The computer readable storage medium may be encoded with instructions that, when executed by a processor, perform: determining if the impedance of the first reactive component requires tuning, and selecting an impedance of the first reactive component if it is determined that the impedance requires tuning.

The computer readable storage medium may be encoded with instructions that, when executed by a processor, perform: selecting an impedance of a third reactive component to tune the second operational resonant frequency band of the second antenna and tune a phase shift provided by the third reactive component, the third reactive component being coupled to the second port and to the second reactive component at a second junction, at least the third reactive component is configured to have an impedance that shifts the phase of a third signal, in the first operational resonant frequency band, received from the second antenna, and the second reactive component is configured to have an impedance that shifts the phase of a fourth signal, in the first operational resonant frequency band, received from the transceiver, so that the third signal and the fourth signal at least partially destructively interfere with one another at the second junction.

The computer readable storage medium may be encoded with instructions that, when executed by a processor, perform: determining if the impedance of the third reactive component requires tuning, and selecting an impedance of the third reactive component if it is determined that the impedance requires tuning.

According to various, but not necessarily all, embodiments of the invention there is provided a computer program that, when run on a computer, performs: selecting an impedance of a first reactive component to tune a first operational resonant frequency band of a first antenna and tune a phase shift provided by the first reactive component, the first reactive component being coupled to a first port configured to receive signals from a transceiver and to receive the first antenna, the first antenna being configured to operate in the first operational resonant frequency band, and coupled to a second reactive component, the second reactive component being coupled to a second port configured to receive signals from a transceiver and to receive a second antenna, the second antenna being configured to operate in a second operational frequency band, at least the first reactive component being configured to have an impedance that shifts the phase of a first signal, in the second operational resonant frequency band, received from the first antenna, and the second reactive component being configured to have an impedance that shifts the phase of a second signal, in the second operational resonant frequency band, received from the transceiver, so that the first signal and the second signal at least partially destructively interfere with one another at the first junction.

The computer program may, when run on a computer, perform: determining if the impedance of the first reactive component requires tuning, and selecting an impedance of the first reactive component if it is determined that the impedance requires tuning.

The computer program may, when run on a computer, perform: selecting an impedance of a third reactive component to tune the second operational resonant frequency band of the second antenna and tune a phase shift provided by the third reactive component, the third reactive component being coupled to the second port and to the second reactive component at a second junction, at least the third reactive component is configured to have an impedance that shifts the phase of a third signal, in the first operational resonant frequency band, received from the second antenna, and the second reactive component is configured to have an impedance that shifts the phase of a fourth signal, in the first operational resonant frequency band, received from the transceiver, so that the third signal and the fourth signal at least partially destructively interfere with one another at the second junction.

The computer program may, when run on a computer, perform: determining if the impedance of the third reactive component requires tuning, and selecting an impedance of the third reactive component if it is determined that the impedance requires tuning.

According to various, but not necessarily all, embodiments of the invention there is provided a method comprising: selecting an impedance of a first reactive component to tune a first operational resonant frequency band of a first antenna and tune a phase shift provided by the first reactive component, the first reactive component being coupled to a first port configured to receive signals from a transceiver and to receive the first antenna, the first antenna being configured to operate in the first operational resonant frequency band, and coupled to a second reactive component, the second reactive component being coupled to a second port configured to receive signals from a transceiver and to receive a second antenna, the second antenna being configured to operate in a second operational frequency band, at least the first reactive component being configured to have an impedance that shifts the phase of a first signal, in the second operational resonant frequency band, received from the first antenna, and the second reactive component being configured to have an impedance that shifts the phase of a second signal, in the second operational resonant frequency band, received from the transceiver, so that the first signal and the second signal at least partially destructively interfere with one another at the first junction.

The method may further comprise: determining if the impedance of the first reactive component requires tuning, and selecting an impedance of the first reactive component if it is determined that the impedance requires tuning.

The method may further comprise: selecting an impedance of a third reactive component to tune the second operational resonant frequency band of the second antenna and tune a phase shift provided by the third reactive component, the third reactive component being coupled to the second port and to the second reactive component at a second junction, at least the third reactive component is configured to have an impedance that shifts the phase of a third signal, in the first operational resonant frequency band, received from the second antenna, and the second reactive component is configured to have an impedance that shifts the phase of a fourth signal, in the first operational resonant frequency band, received from the transceiver, so that the third signal and the fourth signal at least partially destructively interfere with one another at the second junction.

The method may further comprise: determining if the impedance of the third reactive component requires tuning, and selecting an impedance of the third reactive component if it is determined that the impedance requires tuning.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

In the following description, the wording 'connect' and 'couple' and their derivatives mean operationally connected/coupled. It should be appreciated that any number or combination of intervening components can exist (including no intervening components). Additionally, it should be appreciated that the connection/coupling may be a physical galvanic connection and/or an electromagnetic connection.

Figure 1:
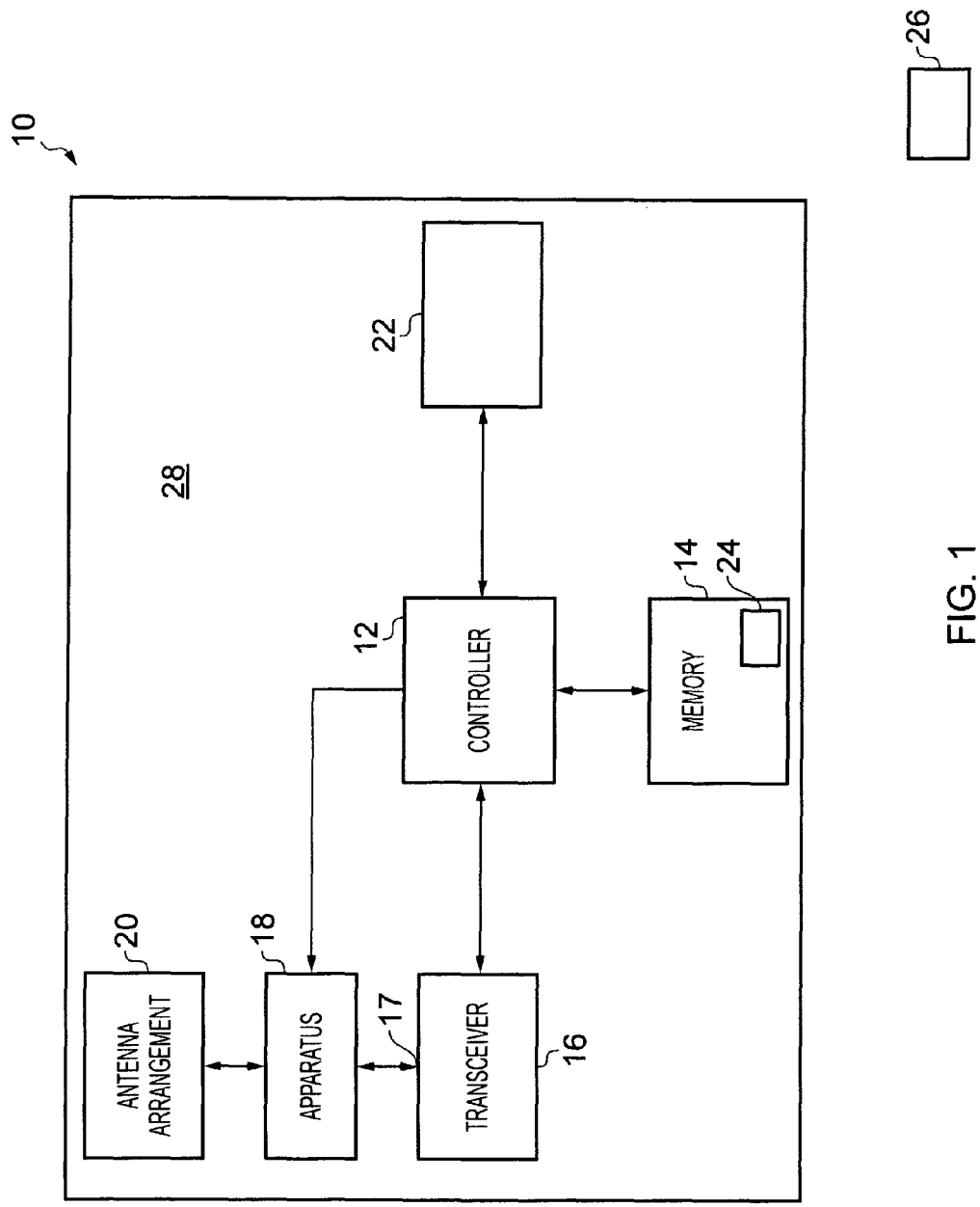
FIG. 1 illustrates a schematic diagram of a device according to various embodiments of the present invention.

FIG. 1 illustrates a schematic diagram of a device 10 according to various embodiments of the invention. The device 10 includes a controller 12, a memory 14, a transceiver 16, apparatus 18, an antenna arrangement 20 and functional circuitry 22.

The device 10 may be any apparatus and may be a portable electronic device (for example, a mobile cellular telephone, a personal digital assistant (PDA), a palmtop computer or a laptop computer), a non-portable electronic device (for example, a base station) or a module for such devices. As used here, 'module' refers to a unit or apparatus that excludes certain parts/components that would be added by an end manufacturer or a user.

The controller 12 may be any suitable processor and may be a microprocessor for example. In some embodiments, the controller 12 includes multiple processors. Implementation of the controller 12 can be in hardware alone (for example, a circuit, a processor and so on), have certain aspects in software including firmware alone or can be a combination of hardware and software (including firmware).

The controller 12 may be implemented using instructions that enable hardware functionality, for example, by using executable computer program instructions in a general-purpose or special-purpose processor that may be stored on a computer readable storage medium (for example, a disk, a memory and so on) to be executed by such a processor.

The controller 12 is configured to read from and write to the memory 14. The controller 12 may also comprise an output interface via which data and/or commands are output by the controller 12 and an input interface via which data and/or commands are input to the controller 12.

The memory 14 may be any suitable memory and may, for example, be permanent built-in memory such as flash memory or it may be a removable memory such as a hard disk, secure digital (SD) card or a micro-drive. The memory 14 stores a computer program 24 comprising computer program instructions that control the operation of the device 10 when loaded into the controller 12. The computer program instructions 24 provide the logic and routines that enables the device to perform the method illustrated in FIG. 4. The controller 12 by reading the memory 14 is able to load and execute the computer program 24.

The computer program may arrive at the device 10 via any suitable delivery mechanism 26. The delivery mechanism 26 may be, for example, a computer-readable storage medium, a computer program product, a memory device, a record medium such as a Compact Disc (CD-ROM), a Digital Versatile Disc (DVD), a Blu-Ray disc, or any article of manufacture that tangibly embodies the computer program 24. The delivery mechanism 26 may be a signal configured to reliably transfer the computer program 24. The device 10 may propagate or transmit the computer program 24 as a computer data signal.

Although the memory 14 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' and so on, or a 'controller', 'computer', 'processor' and so on, should be understood to encompass not only computers having different architectures such as single /multi-processor architectures and sequential (Von Neumann)/parallel architectures but also specialized circuits such as field-programmable gate arrays (FPGA), application specific circuits (ASIC), signal processing devices and other devices. References to computer program, instructions, code and so on should be understood to encompass software for a programmable processor or firmware such as, for example, the programmable content of a hardware device whether instructions for a processor, or configuration settings for a fixed-function device, gate array or programmable logic device and so on.

The transceiver 16 is connected to the antenna arrangement 20 via the apparatus 18, and is also connected to the controller 12. The port 17 of the transceiver 16 is connected to the apparatus 18 and may have a predetermined impedance (for example, the port 17 of the transceiver 16 may have an impedance of fifty ohms).

The controller 12 is configured to provide data to the transceiver 16. The transceiver 16 is configured to encode the data and provide the encoded data to the antenna arrangement 20 for transmission. The antenna arrangement 20 is configured to transmit the encoded data as a radio signal. The antenna arrangement 20 is also configured to receive a radio signal. The transceiver 16 receives the radio signal from the antenna arrangement 20 and decodes the radio signal into data. The transceiver 16, apparatus 18 and the antenna arrangement 20 may form a multiple-input and multiple-output (MIMO) arrangement.

The apparatus 18 includes reactive components and will be described in detail in the following paragraphs with reference to FIGS. 2 to 5. The apparatus 18 may be separate from, and connectable to, the transceiver 16. In other embodiments, the apparatus 18 may be integral with the transceiver 16, or the antenna arrangement 20, or both the antenna arrangement 20 and transceiver 16.

The antenna arrangement 20 may include any combination of suitable antennas. For example, the antenna arrangement 20 may include (but is not limited to) monopole antennas, dipole antennas, planar inverted F antennas (PIFA), planar inverted L antennas (PILA), and loop antennas. At least two of the antennas of the antenna arrangement 20 are connectable to the transceiver 16 via the apparatus 18 (the remaining antennas may be connected to the transceiver 16 via other circuitry).

The antenna arrangement 20, the apparatus 18 and the transceiver 16 may be configured to operate in a plurality of different operational frequency bands and via a plurality of different protocols. For example, the different operational frequency bands and protocols may include (but are not limited to) Long Term Evolution (LTE) 700 (US) (698.0-716.0 MHz, 728.0-746.0 MHz), LTE 1500 (Japan) (1427.9-1452.9 MHz, 1475.9-1500.9 MHz), LTE 2600 (Europe) (2500-2570 MHz, 2620-2690 MHz), amplitude modulation (AM) radio (0.535-1.705 MHz); frequency modulation (FM) radio (76-108 MHz); Bluetooth (2400-2483.5 MHz); wireless local area network (WLAN) (2400-2483.5 MHz); helical local area network (HLAN) (5150-5850 MHz); global positioning system (GPS) (1570.42-1580.42 MHz); US—Global system for mobile communications (US-GSM) 850 (824-894 MHz); European global system for mobile communications (EGSM) 900 (880-960 MHz); European wideband code division multiple access (EU-WCDMA) 900 (880-960 MHz); personal communications network (PCN/DCS) 1800 (1710-1880 MHz); US wideband code division multiple access (US-WCDMA) 1900 (1850-1990 MHz); wideband code division multiple access (WCDMA) 2100 (Tx: 1920-1980 MHz Rx: 2110-2180 MHz); personal communications service (PCS) 1900 (1850-1990 MHz); ultra wideband (UWB) Lower (3100-4900 MHz); UWB Upper (6000-10600 MHz); digital video broadcasting—handheld (DVB-H) (470-702 MHz); DVB-H US (1670-1675 MHz); digital radio mondiale (DRM) (0.15-30 MHz); worldwide interoperability for microwave access (WiMax) (2300-2400 MHz, 2305-2360 MHz, 2496-2690 MHz, 3300-3400 MHz, 3400-3800 MHz, 5250-5875 MHz); digital audio broadcasting (DAB) (174.928-239.2 MHz, 1452.96-1490.62 MHz); radio frequency identification low frequency (RFID LF) (0.125-0.134 MHz); radio frequency identification high frequency (RFID HF) (13.56-13.56 MHz); radio frequency identification ultra high frequency (RFID UHF) (433 MHz, 865-956 MHz, 2450 MHz).

An operational frequency band is a frequency range over which an antenna can efficiently operate using a protocol. Efficient operation occurs, for example, when the antenna's return loss S11 is greater than an operational threshold such as 4 dB or 6 dB.

The functional circuitry 22 includes other (optional) circuitry. For example, in the embodiment where the device 10 is a mobile cellular telephone, the functional circuitry 22 includes input/output devices such as an audio input device (a microphone for example), an audio output device (a loudspeaker for example) and a display.

The components that provide the controller 12, the memory 14, the transceiver 16, the apparatus 18, the antenna arrangement 20 and the functional circuitry 22 may be interconnected via one or more printed wiring boards (PWB) 28. In various embodiments, the printed wiring board 28 may be used as a ground member for the antenna arrangement 20 by using one or more layers of the printed wiring board 28. In other embodiments, another conductive part of the device 10 (a battery cover, or a metallic cover for example) may be used as a ground member for the antenna arrangement 20.

Figure 2:
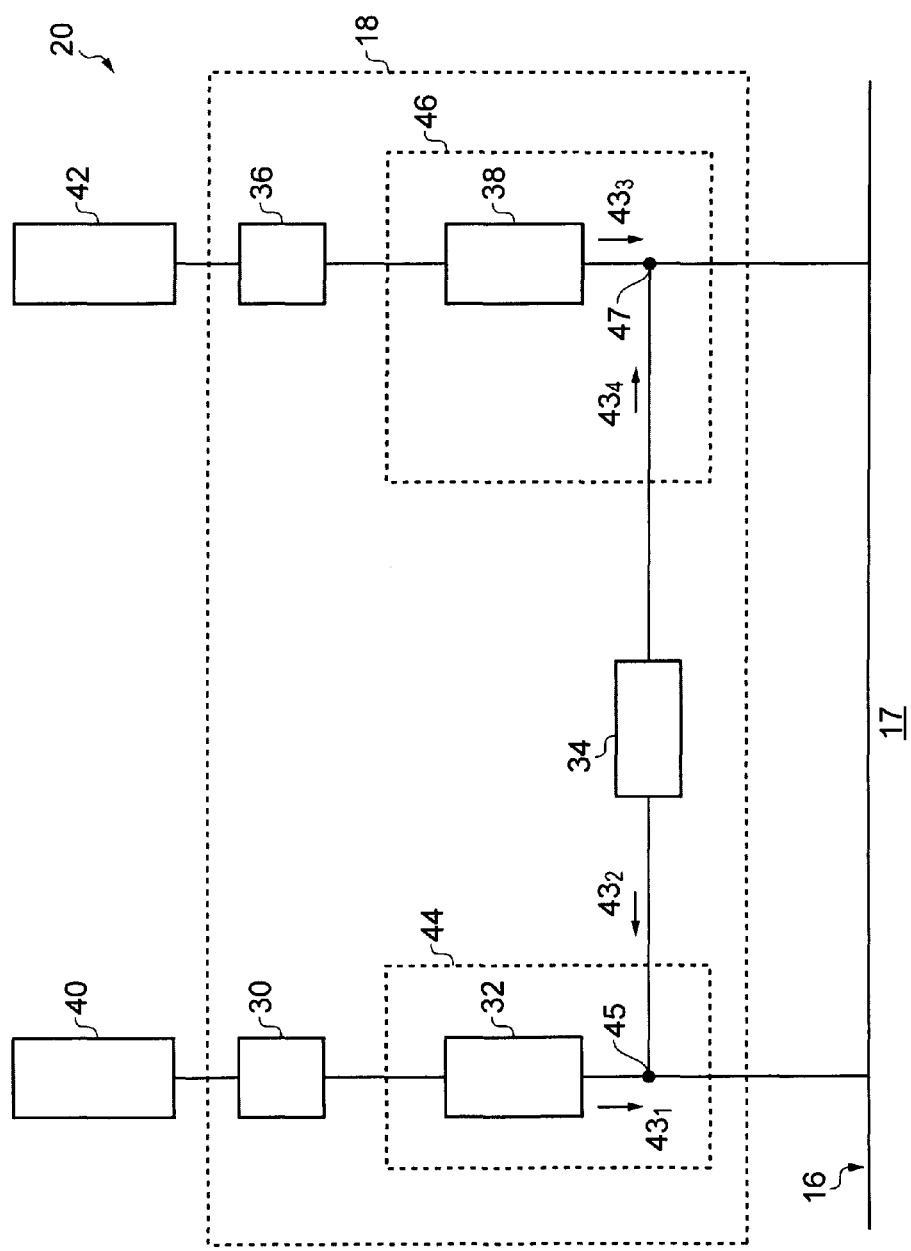
FIG. 2 illustrates a schematic diagram of an apparatus according to various embodiments of the present invention.

FIG. 2 illustrates a schematic diagram of an apparatus 18 according to various embodiments of the invention. The apparatus 18 includes a first port 30, a first reactive component 32, a second reactive component 34, a second port 36 and a third reactive component 38.

The first port 30 may comprise any suitable conductive material and may comprise copper for example. The first port 30 is configured to receive a first antenna 40. The first port 30 may be specially adapted to connect to the first antenna 40 or may be able to connect to any antenna (including the first antenna 40). The first antenna 40 may be any antenna and may be, and not limited to, a monopole antenna, a dipole antenna, a planar inverted F antenna (PIFA), a planar inverted L antenna (PILA), or a loop antenna. The physical length of the first antenna 40 may be smaller than the desired wavelengths of operation and may therefore be non-resonant at those wavelengths. In other embodiments, the physical length of the first antenna 40 may be similar to the desired wavelengths of operation and may be resonant or near-resonant at those wavelengths.

The second port 36 may comprise any suitable conductive material and may comprise copper for example. The second port 36 is configured to receive a second antenna 42. The second port 36 may be specially adapted to connect to the second antenna 42 or may be able to connect to any antenna (including the second antenna 42). The second antenna 42 may be any antenna and may be, and not limited to, a monopole antenna, a dipole antenna, a planar inverted F antenna (PIFA), a planar inverted L antenna (PILA), or a loop antenna. The physical length of the second antenna 42 may be smaller than the desired wavelengths of operation and may therefore be non-resonant at those wavelengths. In other embodiments, the physical length of the second antenna 42 may be similar to the desired wavelengths of operation and may be resonant or near-resonant at those wavelengths.

The first reactive component 32 is connected to the first port 30 and is coupled to the transceiver 16 (via the port 17). The first reactive component 32 may be any reactive component or combination of reactive components and may include a capacitor or an inductor for example. In some embodiments, the first reactive component 32 is variable and has a plurality of selectable impedances. For example, the first reactive component 32 may be a variable capacitor or a variable inductor. The controller 12 may be configured to control the first reactive component 32 and select an impedance of the first reactive component 32.

The third reactive component 38 is connected to the second port 36 and is coupled to the transceiver 16 (via the port 17). The third reactive component 38 may be any reactive component or combination of reactive components and may include a capacitor or an inductor for example. In some embodiments, the third reactive component 38 is variable and has a plurality of selectable impedances. For example, the third reactive component 38 may be a variable capacitor or a variable inductor. The controller 12 may be configured to control the third reactive component 38 and select an impedance of the third reactive component 38. The third reactive component 38 is optional and in some embodiments, the third reactive component 38 may not be present in the apparatus 18.

It should be appreciated that the first reactive component 32 provides first matching circuitry 44 for the first antenna 40. The first matching circuitry 44 may include further reactive components in addition to the first reactive component 32. The first matching circuitry 44 is configured to impedance match (conjugate match) the first antenna 40 to the impedance of the port 17 of the transceiver 16 over a first operational resonant frequency band. For example, the first matching circuitry 44 may be configured to transform the impedance of the first antenna 40 to be substantially equal to fifty ohms over the first operational resonant frequency band. Consequently, the first antenna 40 is operable over the first operational resonant frequency band when coupled to the first matching circuitry 44. Where the first reactive component 32 has a variable impedance, the resonant frequencies within the first operational resonant frequency band may be varied.

The third reactive component 38 provides second matching circuitry 46 for the second antenna 42. The second matching circuitry 46 may include further reactive components in addition to the third reactive component 38. The second matching circuitry 46 is configured to impedance match (conjugate match) the second antenna 42 to the impedance of the port 17 of the transceiver 16 over a second operational resonant frequency band. For example, the second matching circuitry 46 may be configured to transform the impedance of the second antenna 42 to be substantially equal to fifty ohms over the second operational resonant frequency band. Consequently, the second antenna 42 is operable over the second operational resonant frequency band when coupled to the second matching circuitry 46. Where the third reactive component 38 has a variable impedance, the resonant frequencies within the second operational resonant frequency band may be varied.

The second operational resonant frequency band may be the same as the first operational resonant frequency band (that is, the second operational resonant frequency band may wholly overlap the first operational resonant frequency band in frequency, for example, European global system for mobile communications 900 (880-960 MHz) and European wideband code division multiple access 900 (880-960 MHz)). In other embodiments, the second operational resonant frequency band may only partially overlap the first operational resonant frequency band in frequency (that is, the first and second resonant frequency bands share some, not all, frequencies). In other embodiments, the second operational resonant frequency band may not overlap the first operational resonant frequency band at all (that is, the first and second resonant frequency bands do not share any frequencies).

The second reactive component 34 is connected between the first matching circuitry 44 and the second matching circuitry 46 at a first junction 45 and a second junction 47 respectively. The first matching circuitry 44 may include further reactive components in addition to the first reactive component 32 positioned between the first junction 45 and the port 17 of the transceiver 16. The second matching circuitry 46 may include further reactive components in addition to the third reactive component 38 positioned between the second junction 47 and the port 17 of the transceiver 16.

The second reactive component 34 may be any reactive component or combination of reactive components and may be an inductor, a capacitor or a combination of inductors and capacitors for example. The second reactive component 34 may include a switch for switching the second reactive component 34 in or out of the circuit. The second reactive component 34 may be tunable (that is, have a plurality of selectable impedances) and may be controlled by the controller 12. The second reactive component 34 may also be referred to as a 'decoupling component'.

When the second antenna 42 is operating in the second operational resonant frequency band, the first antenna 40 receives a first signal $43_1$ having frequencies in the second operational resonant frequency band wirelessly from the second antenna 42 which pass through the first reactive component 32 to the first junction 45. Additionally, a second signal $43_2$ (a portion of the signals in the second operational resonant frequency band from the transceiver 16) pass through the second reactive component 34 and are received at the first junction 45.

The first reactive component 32 is configured to have an impedance and location in the apparatus 10 that shifts the phase of the first signal $43_1$ received from the first antenna 40. The second reactive component 34 is configured to have an impedance and location in the apparatus 10 that shifts the phase of the second signal $43_2$ so that the first signal $43_1$ and the second signal $43_2$ are out of phase with one another and at least partially destructively interfere with one another at the first junction 45. The first and second signals $43_1$, $43_2$ from the two different paths at least partially cancel one another due to the destructive interference (due to being substantially one hundred and eighty degrees out of phase and having similar amplitudes). Consequently, little to no signal in the second operational resonant frequency band may be measured at the port 17 (from the first antenna 40) when the second antenna 42 is operating in the second operational resonant frequency band. In other words, the wireless coupling between the first and second antennas 40, 42 is cancelled due to the coupling through the second reactive component 34 (that is, the decoupling path).

From the preceding paragraph, it should be appreciated that the first and second reactive components 32, 34 may be considered to function as phase shifters and are configured so that the first and second signals $43_1$ and $43_2$ from the two different paths (including the over-the-air signal path) are shifted substantially one hundred and eighty degrees out of phase and consequently cancel one another due to destructive interference at the second operational resonant frequency band.

The first reactive component 32 may also be configured to have an impedance that changes the amplitude of the first signal $43_1$ received from the first antenna 40. The second reactive component 34 may be configured to have an impedance that changes the amplitude of the second signal $43_2$ so that the first signal $43_1$ and the second signal $43_2$ at least partially destructively interfere with one another at the first junction 45.

Where the first reactive component 32 has a variable impedance, the phase shift provided by the first reactive component 32 is also variable and the impedance of the first reactive component 32 may be selected to compensate for changes in impedance of the third reactive component 38 (that is, changes in the frequency band of the second operational resonant frequency band). Additionally, where the second reactive component 34 has a variable impedance, the phase shift provided by the second reactive component 34 is also variable and the impedance of the second reactive component 34 may be selected to compensate for changes in impedance of the third reactive component 38 (that is, changes in the frequency band of the second operational resonant frequency band).

The first and second reactive components 32, 34 can be understood to provide an 'isolation notch' where the isolation provided by these components forms a peak over a frequency band. Where the first and second reactive components 32, 34 have variable impedances, the frequency band of the isolation notch can be varied (for example, shifted up or down in frequency) by varying the impedances of the first and second reactive components 32, 34.

When the first antenna 40 is operating in the first operational resonant frequency band, the second antenna 42 receives a third signal $43_3$ having frequencies in the first operational resonant frequency band wirelessly from the first antenna 40 which pass through the third reactive component 38 to the second junction 47. Additionally, a fourth signal $43_4$ (a portion of the signals in the first operational resonant frequency band from the transceiver 16) pass through the second reactive component 34 and are received at the second junction 47.

The third reactive component 38 is configured to have an impedance and location in the apparatus 10 that shifts the phase of the third signal $43_3$ received from the second antenna 42. The second reactive component 34 is configured to have an impedance and location in the apparatus 10 that shifts the phase of the fourth signal $43_4$ so that the third signal $43_3$ and the fourth signal $43_4$ are out of phase with one another and at least partially destructively interfere with one another at the second junction 47. The third and fourth signals $43_3$, $43_4$ from the two different paths at least partially cancel one another due to the destructive interference (due to being substantially one hundred and eighty degrees out of phase and having similar amplitudes). Consequently, little to no signal in the first operational resonant frequency band may be measured at the port 17 (from the second antenna 42) when the first antenna 40 is operating in the first operational resonant frequency band. In other words, the wireless coupling between the first and second antennas 40, 42 is cancelled due to the coupling through the second reactive component 34 (that is, the decoupling path).

From the preceding paragraph, it should be appreciated that the second and third reactive components 34, 38 may be considered to function as phase shifters and are configured so that the third and fourth signals $43_3$, $43_4$ from the two different paths (including the over-the-air signal path) are shifted substantially one hundred and eighty degrees out of phase and consequently cancel one another due to destructive interference at the first operational frequency band.

The third reactive component 38 may also be configured to have an impedance that changes the amplitude of the third signal $43_3$ received from the second antenna 42. The second reactive component 34 may be configured to have an impedance that changes the amplitude of the fourth signal $43_4$ so that the third signal $43_3$ and the fourth signal $43_4$ at least partially destructively interfere with one another at the second junction 47.

Where the third reactive component 38 has a variable impedance, the phase shift provided by the third reactive component 38 is also variable and the impedance of the third reactive component 38 may be selected to compensate for changes in impedance of the first reactive component 32 (that is, changes in the frequency band of the first operational resonant frequency band). Additionally, where the second reactive component 34 has a variable impedance, the phase shift provided by the second reactive component 34 is also variable and the impedance of the second reactive component 34 may be selected to compensate for changes in impedance of the first reactive component 32 (that is, changes in the frequency band of the second operational resonant frequency band).

The second and third reactive components 34, 38 can be understood to provide an 'isolation notch' where the isolation provided by these components forms a peak over a frequency band. Where the second and third reactive components 34, 38 have variable impedances, the frequency band of the isolation notch can be varied (for example, shifted up or down in frequency) by varying the impedances of the second and third reactive components 34, 38.

Where the first, second and/or third reactive components 32, 34, 38 have variable resistances (that is, they include a variable resistor or a variable inductor/capacitor having a variable resistance), the resistance of the reactive components 32, 34, 38 may be controlled to fine tune the phase and/or amplitude shifts provided by these components.

If the first and third reactive components 32, 38 have substantially the same impedance and the first and second antennas 40, 42 are substantially the same (i.e. they have substantially the same physical length), the optimum impedance for the second reactive component 34 to cause destructive interference may be determined from equation 1.

$$Z_m = Z_{21} - \frac{(Z_{11} + Z_s)^2}{Z_{21}} \qquad \text{Equation 1}$$

Where $Z_m$ is the impedance of the second reactive component 34, $Z_{21}$ is the change in impedance of the first antenna 40 due to electromagnetic coupling with the second antenna 42 where the second reactive component 34 is not included in the circuit, $Z_{11}$ is the impedance of the first antenna 40 and $Z_S$ is the impedance of the first reactive component 32.

If the first and third reactive components 32, 38 have substantially the same impedance but the first and second antennas 40, 42 are different (i.e. they have substantially different impedances), the optimum impedance for the second reactive component 34 to cause destructive interference may be determined from equation 2.

$$Z_m = \frac{Z_{21}^2 - Z_{11}Z_{22} - Z_{11}Z_s - Z_{22}Z_s - Z_s^2}{Z_{21}} \qquad \text{Equation 2}$$

Where $Z_m$ is the impedance of the second reactive component 34, $Z_{21}$ is the change in impedance of the first antenna 40 due to electromagnetic coupling with the second antenna 42 where the second reactive component 34 is not included in the circuit, $Z_{11}$ is the impedance of the first antenna 40, $Z_{22}$ is the impedance of the second antenna 42 and $Z_S$ is the impedance of the first reactive component 32.

In order to increase the efficiency of the apparatus 18, the real part of the impedance of the second reactive component 34 may be minimized by minimizing the real part of the mutual impedance of the first and third reactive components 32, 38.

Embodiments of the present invention provide several advantages. One such advantage is that the phase shifts provided by the reactive components 32, 34, 38 may at least partially isolate the first and second antennas 40, 42 from one another (even where the first and second operational resonant frequency bands partially or wholly overlap one another in frequency). This may enable the first and second antennas 40, 42 to be placed in relatively close proximity to one another without substantially affecting their impedances and/or radiated performance. For example, the first and second antennas 40, 42 may be placed at the same end of a portable electronic device and in close proximity to one another (for example, at a distance of 40 mm from one another). This may advantageously enable the size of the device 10 to be reduced and/or provide valuable space elsewhere for other antennas and/or components or modules.

Another advantage provided by embodiments of the present invention is that since the phase shifts are provided at least in part by the first and third reactive components 32, 38, the tuning of the first and second antennas 40, 42 may be synchronized with the tuning of the phase shifts. Consequently, embodiments of the invention may provide isolation for the first and second antennas 40, 42 across various different operational frequency bands.

A further advantage provided by embodiments of the present invention is that the radiation patterns of the first and second antennas 40, 42 have relatively low envelope correlation and relatively high phase de-correlation and these properties follow the tuning of the first and second antenna 40, 42 resonant frequency bands.

Figure 3:
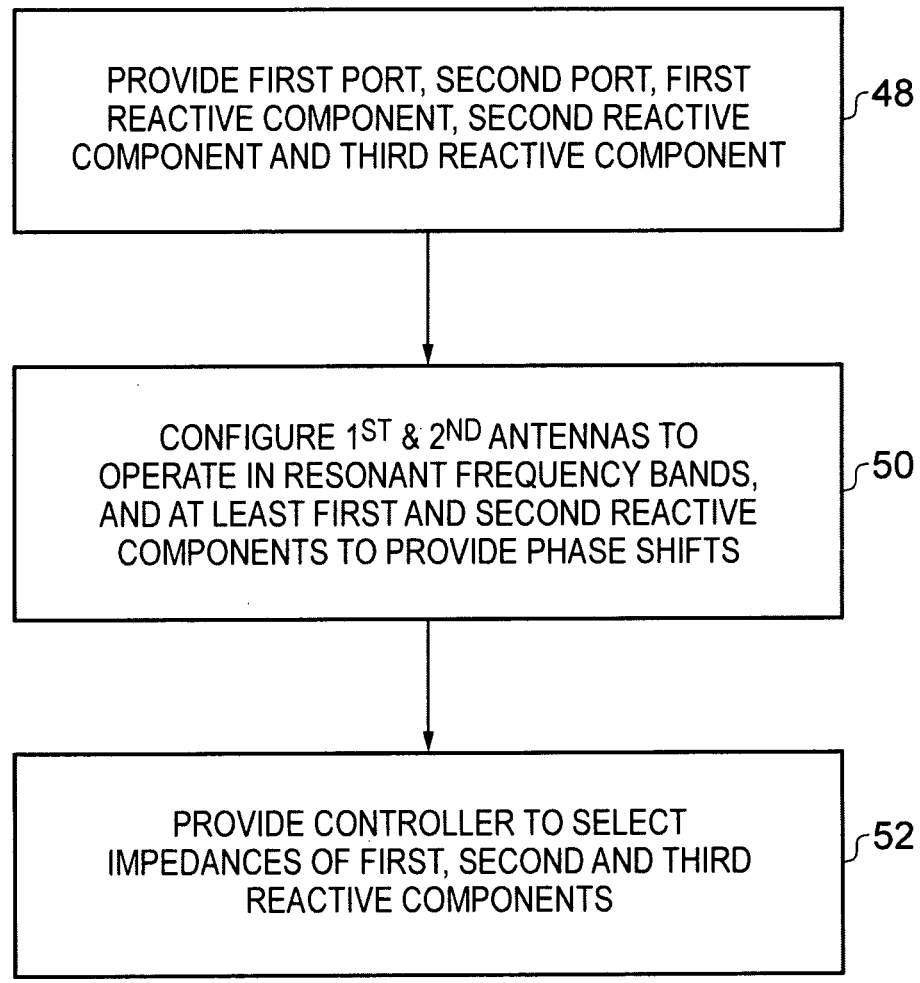
FIG. 3 illustrates a flow diagram of a method according to various embodiments of the present invention.

FIG. 3 illustrates a flow diagram of a method for manufacturing an apparatus 18 according to various embodiments of the invention. At block 48, the method includes providing the first port 30, the second port 36, the first reactive component 32, the second reactive component 34 and (optionally) the third reactive component 38.

Figure 4:
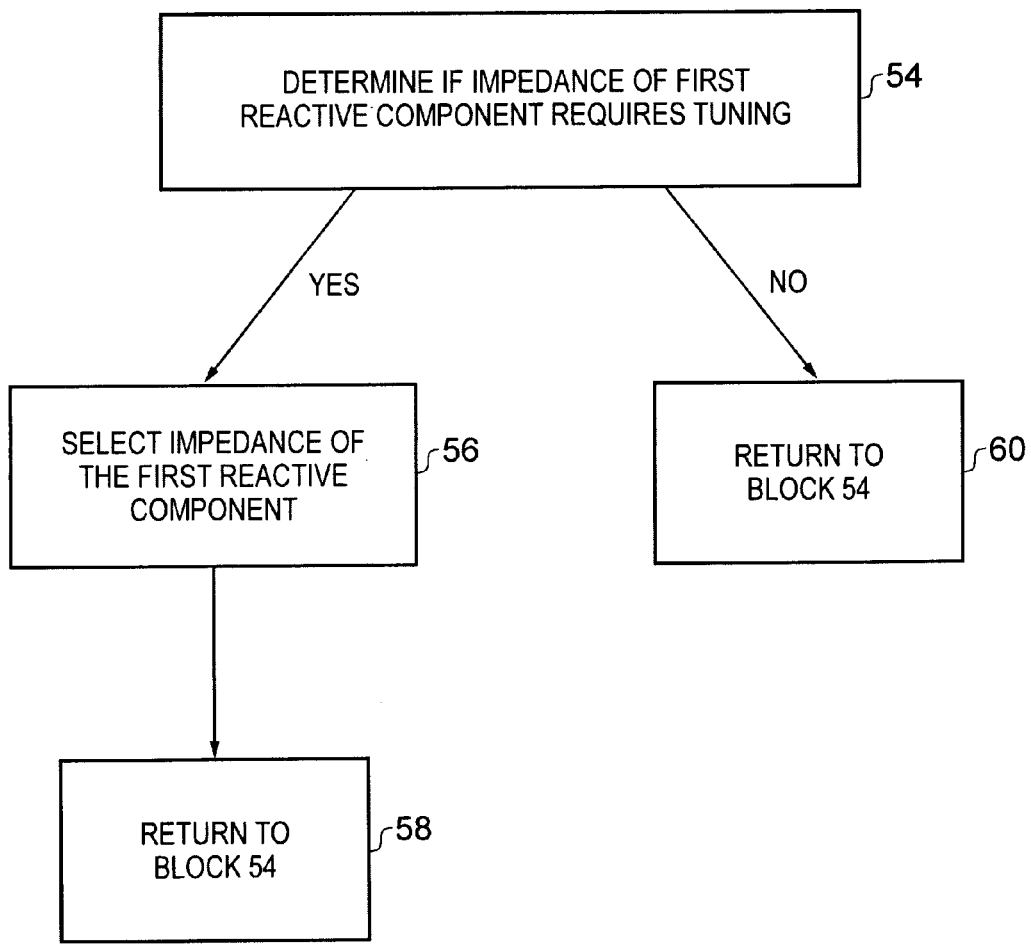
FIG. 4 illustrates a flow diagram of a method according to various embodiments of the present invention.

At block 50, the method includes configuring the first antenna 40 to be operable in the first operational resonant frequency band and configuring the second antenna 42 to be operable in the second operational resonant frequency band. For example, the first and second matching circuitry 44, 46 may be configured to impedance match the first and second antennas 40, 42 at the first and second operational frequency bands to the transceiver 16. Block 50 also includes configuring at least the first and second reactive components 32, 34 to provide phase shifts to the first and second signals $43_1$, $43_2$ as described above. Block 50 may also include configuring at least the third and second reactive components 38, 34 to provide phase shifts to the third and fourth signals $43_3$, $43_4$ as described above.

Where the first and/or second and/or third reactive components 32, 34 38 have variable impedances, the method may include block 52. At block 52, the method includes providing the controller 12 and configuring the controller 12 to be able to select the impedance of the first reactive component 32 and/or the third reactive component 38 and/or the second reactive component 34.

Where at least the first reactive component 32 has a variable impedance, the controller 12 may perform the blocks illustrated in FIG. 4. At block 54, the controller 12 determines whether the impedance of the first reactive component 32 requires tuning. For example, if a user places his hand or another object in close proximity to the device 10, the hand/object couples with the first and second antennas 40, 42 and may change the impedances of the first and second antennas 40, 42. The controller 12 may be configured to measure the reflected power at the first port 30 to determine if the impedance of the first antenna 40 has changed and consequently whether the first reactive component 32 requires tuning.

If the controller 12 determines that the first reactive component 32 requires tuning, the method moves to block 56. At block 56, the controller 12 selects an impedance of the first reactive component 32. For example, the controller 12 may access a look up table stored in the memory 14 with the reflected power measurement and obtain a corresponding impedance for the first reactive component 32. The controller 12 may then control the first reactive component to have the impedance obtained from the lookup table and consequently, compensate for the change in the impedances of the first and second antennas 40, 42. Alternatively, in various other embodiments, instead of a lookup table the controller 12 may be configured to measure the reflected power at the first port 30 and compare it with a predetermined threshold value. The controller 12 may then decide based on the difference to control the impedance of the first reactive component until the difference is within an acceptable limit.

Since the phase shift provided by the first reactive component 32 varies with the impedance of the first reactive component 32, the phase shift provided by first reactive component 32 may be varied to compensate for changes in the impedance of the second antenna 42 (that is, the phase shift may be varied to compensate for the change in the operational frequency band of the second antenna 42). Consequently, the first antenna 40 remains substantially isolated from the second antenna 42 even if a user places his hand or an object in proximity to the device 10.

The method then moves to block 58 which in turn moves the method back to block 54.

If the controller 12 determines that the first reactive component 32 does not require tuning at block 54, the method moves to block 60 and subsequently returns to block 54.

It should be appreciated that method blocks 54 to 60 may be performed for the third reactive component 38 instead of, or in addition to, the first reactive component 32. It should also be appreciated that method blocks 54 to 60 may be performed for the second reactive component 34 instead of, or in addition to, the first and third reactive components 32, 38.

Figure 5:
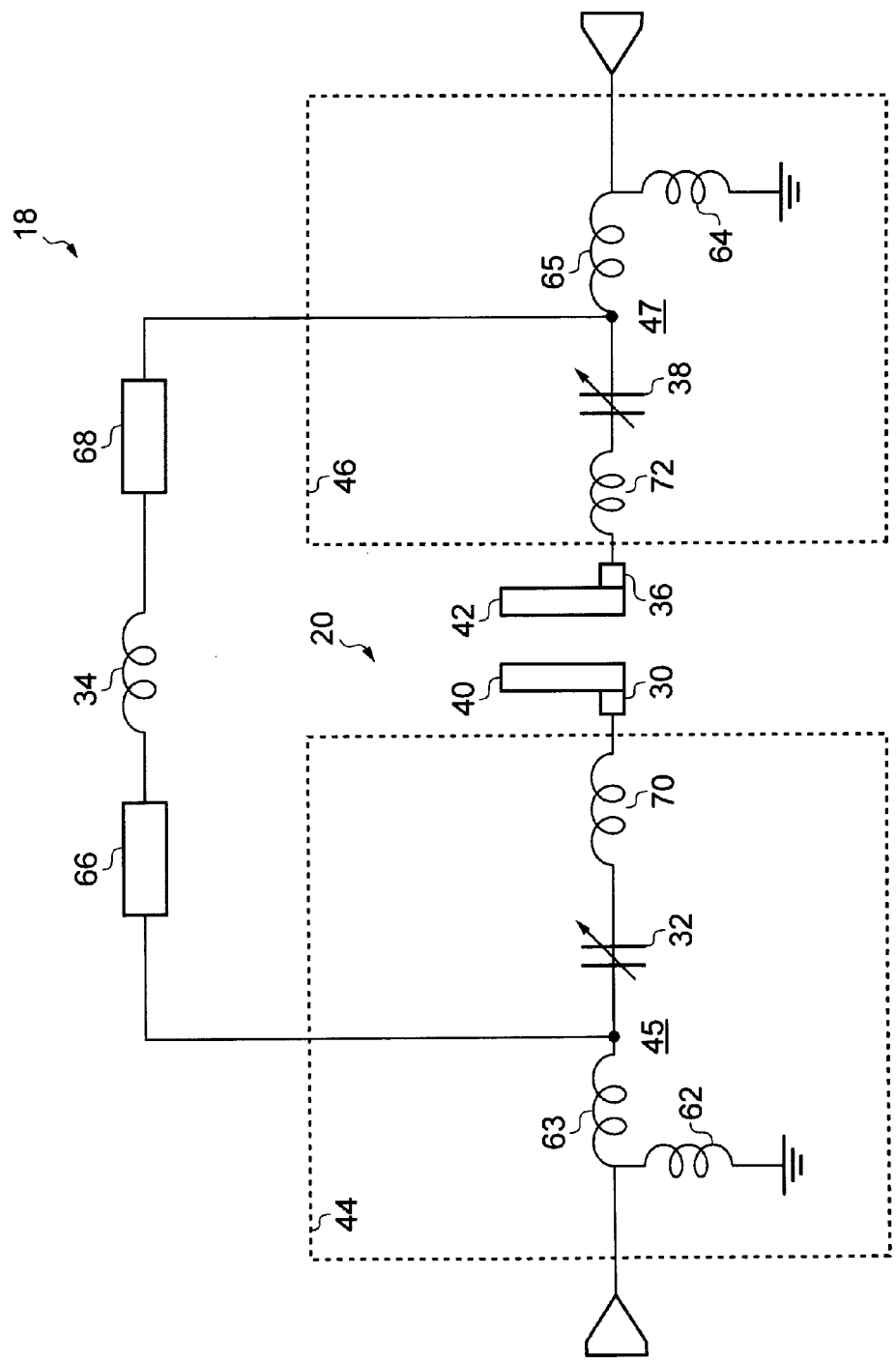
FIG. 5 illustrates a schematic diagram of another apparatus according to various embodiments of the present invention.

FIG. 5 illustrates a schematic diagram of another apparatus 18 and antenna arrangement 20 according to various embodiments of the present invention. The apparatus illustrated in FIG. 5 is similar to the apparatus illustrated in FIG. 2 and where the features are similar, the same reference numerals are used.

In these embodiments, the first reactive component 32 is a variable capacitor, the second reactive component 34 is an inductor and the third reactive component 38 is a variable capacitor. The apparatus 18 also includes an inductor 62, an inductor 63, an inductor 64, an inductor 65 a transmission line 66 and a transmission line 68, an inductor 70 and an inductor 72. The inductor 62 is connected to the inductor 63 and to ground. The inductor 63 is connected to the transmission line 66 and to the first reactive component 32. The inductor 70 is connected to the first reactive component 32 and to the first port 30. The inductor 64 is connected to the inductor 65 and to ground. The inductor 65 is connected to the transmission line 68 and to the third reactive component 38. The inductor 72 is connected to the third reactive component 38 and to the second port 36. The transmission line 66 is connected to the second reactive component 34 and the transmission line 68 is connected to the second reactive component 34. The first matching circuitry 44 is formed by the first reactive component 32 and by the inductors 62, 63, 70 and the second matching circuitry 46 is formed by the third reactive component 38 and by the inductors 64, 65, 72.

The first antenna 40 and/or the second antenna 42 may be switched between operating at different operational frequency bands. For example, the first matching circuitry 44 may be configured to impedance match the first antenna 40 at 700 MHz and at 2600 MHz to the transceiver 16. If it is desired for the second reactive component 34 to present an open circuit at the higher frequency band, the apparatus 18 may include a switch, connected between the second reactive component 34 and the inductor 63 or inductor 65 that may be opened for the higher frequency band. Alternatively, where the second reactive component 34 is an inductor, the inductor 34 may be divided into two parts (that is, two inductors) so that it presents a high impedance at the higher frequency band. Alternatively, a capacitor may be placed in parallel with the second reactive component 34 to form a band stop/notch filter. The impedance of the capacitor is selected so that the notch frequencies overlap the higher frequency band.

In another embodiment, the apparatus 18 may comprise a plurality of impedance boxes. Some or all of the impedance boxes may be tunable (with tunable capacitors, inductors and/or a switch). A first impedance box is formed by the first reactive component 32 and the inductor 70. A second impedance box is formed by the inductors 62 and 63. A third impedance box is formed by the third reactive component 38 and the inductor 72. A fourth impedance box is formed by the inductors 64, 65. A fifth impedance box is formed by the second reactive component 34 and by the transmission lines 66, 68.

The first and third impedance boxes are mainly for antenna frequency tuning (and are also for matching). The phase shifts provided by these boxes (that provide high isolation and low envelope correlation) are automatically tuned and synchronized with the tuning of the antenna frequency.

The second and fourth impedance boxes (together with other impedance boxes) are for antenna impedance matching (and also antenna tuning) so as to match the first and second antennas to fifty ohms (for example) at desired frequencies.

The fifth impedance box is mainly for phase shifting (to provide high isolation notches), low envelope correlation and radiation pattern de-correlation. The fifth impedance box may also influence the matching of the first and second antennas 40, 42. Where the second reactive component 34 is tunable, the tunability of the fifth impedance box may be used to compensate environment changes (for example, the effect of the proximity of a user's head or hand) and to improve the isolation and pattern de-correlation in different use cases.

The blocks illustrated in FIG. 4 may represent steps in a method and/or sections of code in the computer program 24. The illustration of a particular order to the blocks does not necessarily imply that there is a required or preferred order for the blocks and the order and arrangement of the block may be varied. Furthermore, it may be possible for some steps to be omitted.

Although embodiments of the present invention have been described in the preceding paragraphs with reference to various examples, it should be appreciated that modifications to the examples given can be made without departing from the scope of the invention as claimed. For example, the first antenna 40 and the second antenna 42 may be configured to operate in different operational frequency bands and different radio protocols.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a first port configured to receive signals from a transceiver and to receive a first antenna, the first antenna being configured to operate in a first operational resonant frequency band;
   a second port configured to receive signals from a transceiver and to receive a second antenna, the second antenna being configured to operate in a second operational resonant frequency band;
   a first reactive component coupled to the first port;
   a second reactive component coupled to the first reactive component at a first junction and to the second port, wherein at least the first reactive component is configured to have an impedance that shifts the phase of a first signal, in the second operational resonant frequency band, received from the first antenna, and the second reactive component is configured to have an impedance that shifts the phase of a second signal, in the second operational resonant frequency band, received from the transceiver, to cause at least partial destructive interference between the first signal and the second signal at the first junction.

2. The apparatus as claimed in claim 1, wherein the first reactive component has a plurality of selectable impedances for enabling the phase of the first signal to be variably shifted.

3. The apparatus as claimed in claim 2, further comprising a controller configured to select the impedance of the first reactive component and tune the first operational resonant frequency band of the first antenna and tune the phase shift of the first reactive component.

4. The apparatus as claimed in claim 3, wherein the controller is configured to determine if the impedance of the first reactive component requires tuning, and to select an impedance of the first reactive component if the controller determines that the impedance requires tuning.

5. The apparatus as claimed in claim 1, wherein the second reactive component has a plurality of selectable impedances for enabling the phase of the second signal to be variably shifted.

6. The apparatus as claimed in claim 1, wherein the impedance and location of the first reactive component at least partially determines the phase and amplitude of the first signal at the first junction, and the impedance and location of the second reactive component at least partially determines the phase and amplitude of the second signal at the first junction.

7. The apparatus as claimed in claim 1, further comprising a third reactive component coupled to the second port and to the second reactive component at a second junction, wherein at least the third reactive component is configured to have an impedance that shifts the phase of a third signal, in the first operational resonant frequency band, received from the second antenna, and the second reactive component is configured to have an impedance that shifts the phase of a fourth signal, in the first operational resonant frequency band, received from the transceiver, so that the third signal and the fourth signal at least partially destructively interfere with one another at the second junction.

8. The apparatus as claimed in claim 7, wherein the third reactive component has a plurality of selectable impedances for enabling the phase of the third signal to be shifted.

9. The apparatus as claimed in claim 8, further comprising a controller configured to select the impedance of the third reactive component and tune the second operational resonant frequency band of the second antenna and tune the phase shift of the third reactive component.

10. The apparatus as claimed in claim 9, wherein the controller is configured to determine if the impedance of the third reactive component requires tuning, and to select an impedance of the third reactive component if the controller determines that the impedance requires tuning.

11. The apparatus as claimed in claim 7, wherein the second reactive component has a plurality of selectable impedances for enabling the phase of the fourth signal to be variably shifted.

12. The apparatus as claimed in claim 7, wherein the impedance and location of the third reactive component at least partially determines the phase and amplitude of the third signal at the second junction, and the impedance and location of the second reactive component at least partially determine the phase and amplitude of the fourth signal at the second junction.

13. The apparatus as claimed in claim 1, wherein the first antenna is configured to be non resonant in the first operational resonant frequency band, and/or the second antenna is configured to be non-resonant in the second operational resonant frequency band.

14. The apparatus as claimed in claim 1, wherein the first operational resonant frequency band at least partially overlaps with the second operational resonant frequency band.

15. A device or a mobile cellular telephone comprising an apparatus as claimed in claim 1.

16. A method comprising:
providing a first port configured to receive signals from a transceiver and to receive a first antenna, the first antenna being configured to operate in a first operational resonant frequency band, a second port configured to receive signals from a transceiver and to receive a second antenna, the second antenna being configured to operate in a second operational resonant frequency band, a first reactive component being coupled to the first port, a second reactive component being coupled to the first reactive component at a first junction and to the second port; and
configuring at least the first reactive component to have an impedance that shifts the phase of a first signal, in the second operational resonant frequency band, received from the first antenna, and the second reactive component to have an impedance that shifts the phase of a second signal, in the second operational resonant frequency band, received from the transceiver, to cause at least partial destructive interference between the first signal and the second signal at the first junction.

17. The method as claimed in claim 16, wherein the first reactive component has a plurality of selectable impedances for enabling the phase of the first signal to be variably shifted.

18. The method as claimed in claim 17, further comprising providing a controller configured to select the impedance of the first reactive component and tune the first operational resonant frequency band of the first antenna and tune the phase shift of the first reactive component.

19. A computer readable storage medium encoded with instructions that, when executed by a processor perform:
selecting an impedance of a first reactive component to tune a first operational resonant frequency band of a first antenna and tune a phase shift provided by the first reactive component, the first reactive component being coupled to a first port configured to receive signals from a transceiver and to receive the first antenna, the first antenna being configured to operate in the first operational resonant frequency band, and coupled to a second reactive component, the second reactive component being coupled to a second port configured to receive signals from a transceiver and to receive a second antenna, the second antenna being configured to operate in a second operational frequency band, at least the first reactive component being configured to have an impedance that shifts the phase of a first signal, in the second operational resonant frequency band, received from the first antenna, and the second reactive component being configured to have an impedance that shifts the phase of a second signal, in the second operational resonant frequency band, received from the transceiver, to cause at least partial destructive interference between the first signal and the second signal at the first junction.

20. The computer readable storage medium as claimed in claim 19, encoded with instructions that, when executed by a processor, perform:
determining if the impedance of the first reactive component requires tuning, and selecting an impedance of the first reactive component if it is determined that the impedance requires tuning.

* * * * *